(12) United States Patent
Muraki et al.

(10) Patent No.: US 7,005,659 B2
(45) Date of Patent: Feb. 28, 2006

(54) CHARGED PARTICLE BEAM EXPOSURE APPARATUS, CHARGED PARTICLE BEAM EXPOSURE METHOD, AND DEVICE MANUFACTURING METHOD USING THE SAME APPARATUS

(75) Inventors: Masato Muraki, Tokyo (JP); Hiroya Ohta, Tokyo (JP); Osamu Kamimura, Tokyo (JP)

(73) Assignees: Canon Kabushiki Kaisha, Tokyo (JP); Hitachi High-Technologies Corp., Tokyo (JP)

( * ) Notice: Subject to any disclaimer, the term of this patent is extended or adjusted under 35 U.S.C. 154(b) by 0 days.

(21) Appl. No.: 10/885,666

(22) Filed: Jul. 8, 2004

(65) Prior Publication Data

US 2005/0006601 A1 Jan. 13, 2005

(30) Foreign Application Priority Data

Jul. 8, 2003 (JP) ............................. 2003-193834
Jul. 8, 2003 (JP) ............................. 2003-193836

(51) Int. Cl.
*H01J 3/26* (2006.01)
*H01J 37/28* (2006.01)
*G21K 5/10* (2006.01)

(52) U.S. Cl. .......................... 250/492.22; 250/492.23; 250/492.2; 250/396 R

(58) Field of Classification Search ........... 250/492.22, 250/492.23, 492.2, 396 R
See application file for complete search history.

(56) References Cited

U.S. PATENT DOCUMENTS 5,834,783 A 11/1998 Muraki et al. .......... 250/396 R
5,973,332 A 10/1999 Muraki et al. ........... 250/492.2
6,166,387 A 12/2000 Muraki et al. ........... 250/492.2
6,274,877 B1 8/2001 Muraki ................. 250/492.23
6,323,499 B1 11/2001 Muraki et al. ......... 250/492.22
6,483,120 B1 11/2002 Yui et al. ................. 250/491.1
6,515,409 B1 * 2/2003 Muraki et al. ........... 313/359.1
2002/0008207 A1 1/2002 Muraki et al. ............. 250/398
2003/0122087 A1 7/2003 Muraki et al. ............ 250/492.2
2004/0262539 A1 12/2004 Yui ......................... 250/492.2
2005/0006603 A1 1/2005 Muraki ................. 250/492.23
2005/0029473 A1 * 2/2005 Muraki et al. ........... 250/492.1

FOREIGN PATENT DOCUMENTS

JP 9-245708 9/1997

* cited by examiner

*Primary Examiner*—Nikita Wells
(74) *Attorney, Agent, or Firm*—Fitzpatrick, Cella, Harper & Scinto

(57) ABSTRACT

A charged particle beam exposure apparatus has a beam shaping optical system which forms an image of a charged particle source that emits charged particle beams, an aperture array and electrostatic lens which form a plurality of images of the charged particle source from the image of the charged particle source, a reduction electron optical system which reduces and projects the plurality of images of the charged particle source onto a wafer, and the first stigmator which generates astigmatism when the beam shaping optical system forms the image of the charged particle source in order to correct astigmatism generated in the reduction electron optical system. A charged particle beam exposure method of exposing a substrate by scanning with charged particle beams includes an adjustment step of making the size in the scanning direction of charged particle beams on the substrate smaller than the size in a direction perpendicular to the direction.

12 Claims, 11 Drawing Sheets

FIG. 6

| FIRST STIGMATOR | OFF | ON |
|---|---|---|
| SI | ● | ● |
| ON BLANKER ARRAY | ● ● ● | ● ● ● |
| ON WAFER | ● ● ● | ● ● ● |

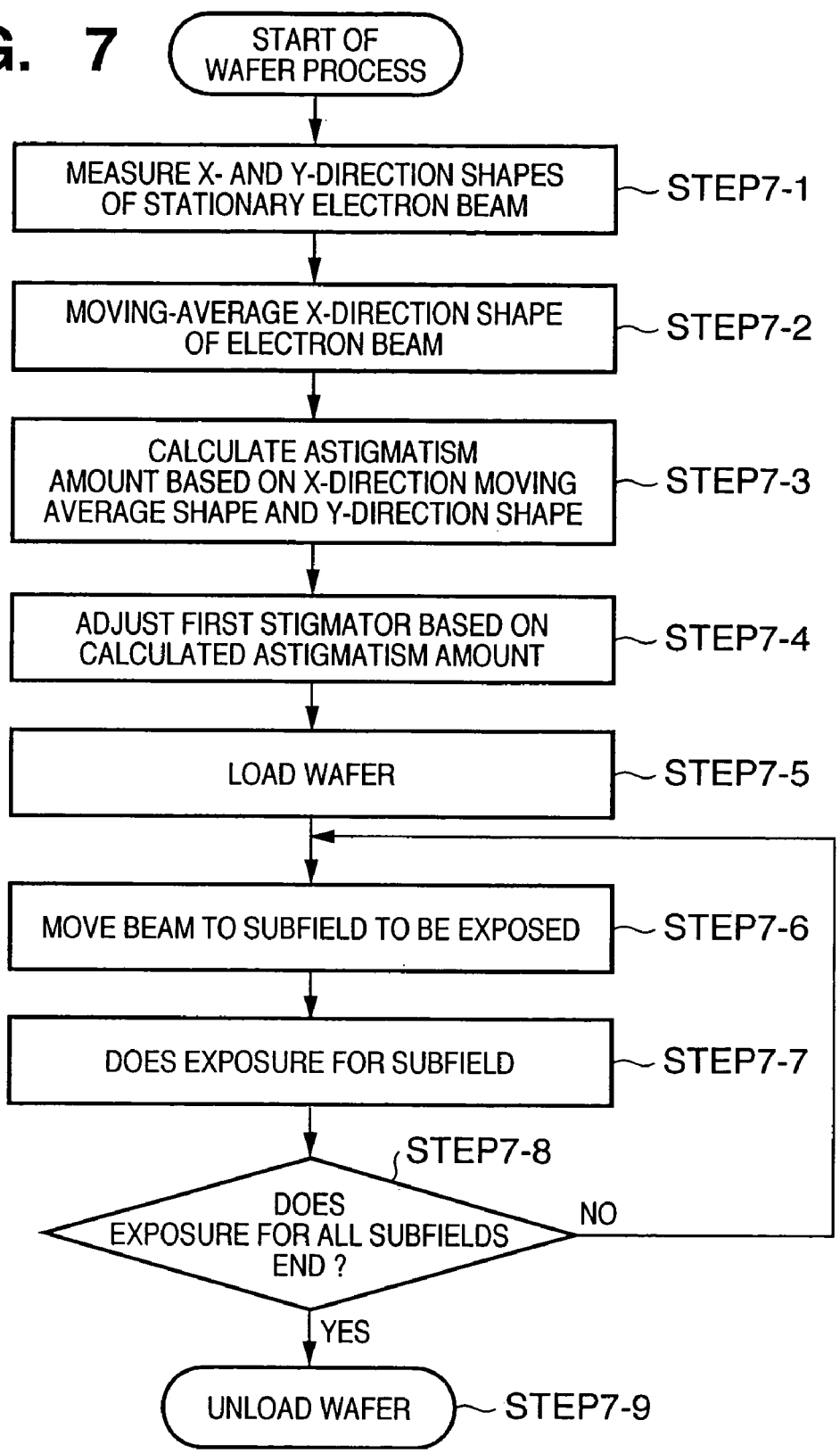

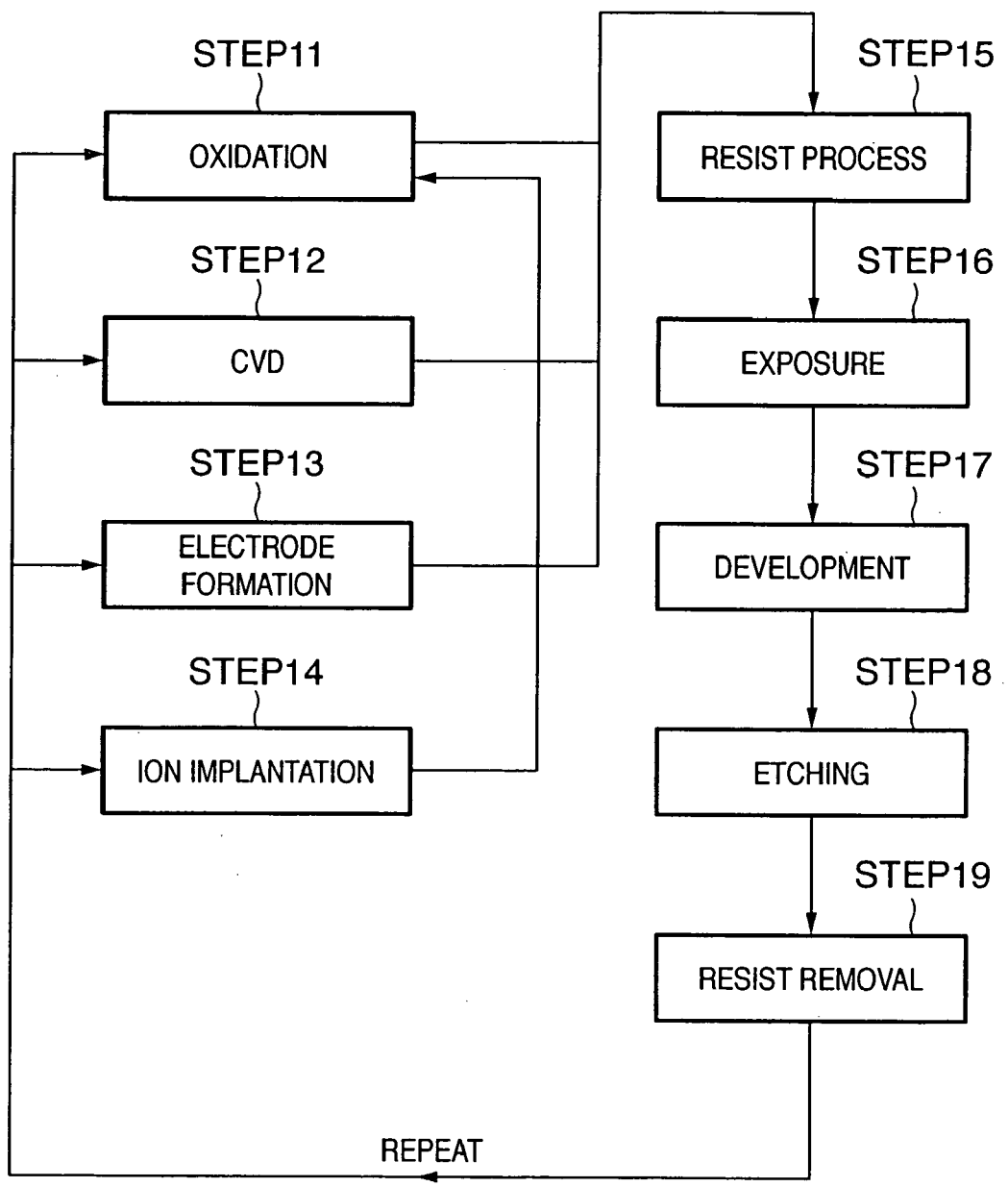

CHARGED PARTICLE BEAM EXPOSURE APPARATUS, CHARGED PARTICLE BEAM EXPOSURE METHOD, AND DEVICE MANUFACTURING METHOD USING THE SAME APPARATUS

FIELD OF THE INVENTION

The present invention relates to a charged particle beam exposure apparatus such as an electron beam exposure apparatus or ion beam exposure apparatus mainly used to expose a semiconductor integrated circuit, and a charged particle beam exposure method and, more particularly, to an electron beam exposure apparatus which directly exposes a pattern on a substrate such as a wafer using an electron beam, an electron beam exposure apparatus which illuminates a master such as a mask with an electron beam and performs projection exposure for the substrate through a reduction electron optical system using the electron beam from the master, and a charged particle beam exposure method of exposing a substrate by scanning with a charged particle beam.

BACKGROUND OF THE INVENTION

Electron beam exposure apparatuses include a point-beam type apparatus which uses a beam spot and a variable rectangular beam type apparatus which uses a beam having a variable-size rectangular cross section.

A point-beam type electron beam exposure apparatus uses a single electron beam and can perform drawing at high resolution. However, the electron beam exposure apparatus has a low throughput and thus is only used in limited applications such as research and development, exposure mask manufacturing, and the like. A variable rectangular beam type electron beam exposure apparatus has a throughput which is one or two orders of magnitude higher than that of a point-beam type apparatus. Since the electron beam exposure apparatus basically uses a single electron beam for drawing, it often has a problem with the throughput in exposing a pattern comprising highly-integrated fine patterns of about 0.1 µm.

To solve this problem, there is available a stencil mask type electron beam exposure apparatus. The apparatus forms a pattern to be drawn in a stencil mask as pattern-transmitting holes and transfers the pattern to be drawn onto a sample surface through a reduction electron optical system by illuminating the stencil mask with an electron beam. Japanese Patent Laid-Open No. 9-245708 discloses a multi electron beam exposure apparatus. The apparatus illuminates a substrate having a plurality of apertures with electron beams, irradiates a sample surface with a plurality of electron beams having passed through the plurality of apertures through a reduction electron optical system, and deflects the plurality of electron beams to scan the sample surface. At the same time, the apparatus draws a desired pattern by individually applying/not applying the plurality of electron beams in accordance with a pattern to be drawn. In both apparatuses, an area to be exposed at one time, i.e., exposure area is larger than a conventional apparatus. Accordingly, the throughput can be increased.

However, since the area to be exposed at one time, i.e., exposure area is larger than the conventional apparatus, use of an astigmatism correcting unit arranged in a reduction electron optical system for correcting astigmatism of the reduction electron optical system causes an aberration other than astigmatism (particularly, distortion). It is thus difficult to form a desired pattern on a wafer.

Japanese Patent Laid-Open No. 9-245708 also discloses an electron beam exposure method of performing drawing while scanning a wafer with electron beams. FIG. 8A shows a conventional scanning electron beam exposure apparatus. In FIG. 8A, reference symbol S denotes an electron source which emits an electron beam, and B, a blanker. An electron beam from the electron source S forms an image of the electron source S at the same position as the blanker B through an electron lens L1. The image of the electron source is reduced and projected onto a wafer W through a reduction electron optical system comprising electron lenses L2 and L3. The blanker B is an electrostatic deflector which is located at the same position as the image of the electron source S formed through the electron lens L1. The blanker B controls whether to irradiate the wafer with an electron beam. More specifically, when the wafer is not to be exposed to an electron beam, the blanker B deflects the electron beam, and a blanking aperture BA located on the pupil of the reduction electron optical system cuts off the deflected electron beam, i.e., an electron beam $EB_{off}$. On the other hand, when the wafer is to be exposed to an electron beam, an electron beam $EB_{on}$ having passed through the blanking aperture BA is controlled by an electrostatic deflector DEF to scan the wafer W.

A method of performing drawing on the wafer by scanning will be described with reference to FIG. 8B. For example, to draw a pattern of a character "A", a drawing region is divided into a plurality of pixels. While the deflector DEF moves an electron beam to perform scanning in the X direction, the blanker B performs control such that each pixel constituting part of the pattern (gray portion) is irradiated with the electron beam and each of the remaining pixels shields the electron beam. When the scanning in the X direction ends, the electron beam is stepped in the Y direction, and the scanning in the X direction restarts. Electron beam irradiation is controlled during the scanning, thereby drawing the pattern.

However, when pixels are exposed by scanning with an electron beam, the position of the electron beam in the scanning direction (X direction) changes over time while the position of the electron beam in a direction perpendicular to the scanning direction (Y direction) remains constant, as shown in FIG. 9A. The pixel exposure distribution in the scanning direction (X direction) has the average value or integrated value obtained when the electron beam moves between the pixels (to be referred to as a moving average hereinafter), as shown in FIG. 9B. FIG. 9C shows the resulting pixel intensity distribution (moving average). In this case, even if an electron beam has an axisymmetric Gaussian intensity distribution, drawing by scanning causes the intensity distribution to spread in the scanning direction (X direction). The intensity distribution looks as if there were astigmatism. Thus, it is difficult to form a desired fine pattern on a wafer.

SUMMARY OF THE INVENTION

The present invention has been made in consideration of the conventional drawback, and has as its object to provide a charged particle beam exposure apparatus capable of, when correcting astigmatism of a reduction electron optical system, reducing generation of an aberration other than astigmatism and performing exposure to a desired pattern.

To attain the above-mentioned object, according to the present invention, there is provided a charged particle beam exposure apparatus which exposes a substrate using a charged particle beam, characterized by comprising first formation means for forming an image of a charged particle source which emits a charged particle beam, second formation means for forming a plurality of images of the charged particle source from the image of the charged particle source, a reduction electron optical system which reduces and projects the plurality of images of the charged particle source onto the substrate, and first astigmatism generation means for generating astigmatism when the first formation means forms the image of the charged particle source in order to correct astigmatism generated in the reduction electron optical system.

According to the present invention, preferably, the apparatus further comprises second astigmatism generation means for generating astigmatism in the reduction electron optical system, wherein out of astigmatisms generated in the reduction electron optical system, astigmatism which does not vary during exposure is corrected by the first astigmatism generation means while varying astigmatism is corrected by the second astigmatism generation means.

The charged particle beam exposure apparatus according to the present invention can preferably be used to, particularly, manufacture a device with a fine pattern such as a semiconductor chip including an IC or LSI, liquid crystal panel, CCD, thin-film magnetic head, micromachine, or the like.

According to the present invention, the first astigmatism generation means generates astigmatism when the first formation means forms an image of the charged particle source, thereby correcting astigmatism on the substrate. This makes it possible to suppress generation of an aberration other than astigmatism and perform exposure to a desired pattern in correcting astigmatism of the reduction electron optical system.

According to the present invention, there is provided a charged particle beam exposure method of exposing a substrate by scanning with a charged particle beam, characterized by comprising an adjustment step of making a size in a scanning direction of a charged particle beam on a substrate smaller than a size in a direction perpendicular to the scanning direction.

The method preferably further comprises a first measurement step of measuring the size in the scanning direction of the charged particle beam on the substrate, and a second measurement step of measuring the size in the direction perpendicular to the scanning direction of the charged particle beam on the substrate, wherein a result of moving-averaging a result of the first measurement step and a result of the second measurement step are evaluated, and the adjustment step is executed based on a result of the evaluation.

A device manufacturing method according to the present invention is characterized in that the above-mentioned charged particle beam exposure method is used to manufacture devices.

The present invention has been made in consideration of the above-mentioned conventional drawback, and has as its object to provide a charged particle beam exposure apparatus capable of performing exposure to a desired fine pattern.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a table for explaining the function of the first stigmator;

FIG. 11 is a flowchart for explaining the wafer process in FIG. 10.

DETAILED DESCRIPTION OF THE PREFERRED EMBODIMENTS

As an example of a charged particle beam exposure apparatus, this embodiment will illustrate an electron beam exposure apparatus. Note that this embodiment can be applied to not only exposure apparatuses using electron beams but also exposure apparatuses using ion beams.

<Explanation of Components of Electron Beam Exposure Apparatus>

Figure 1:
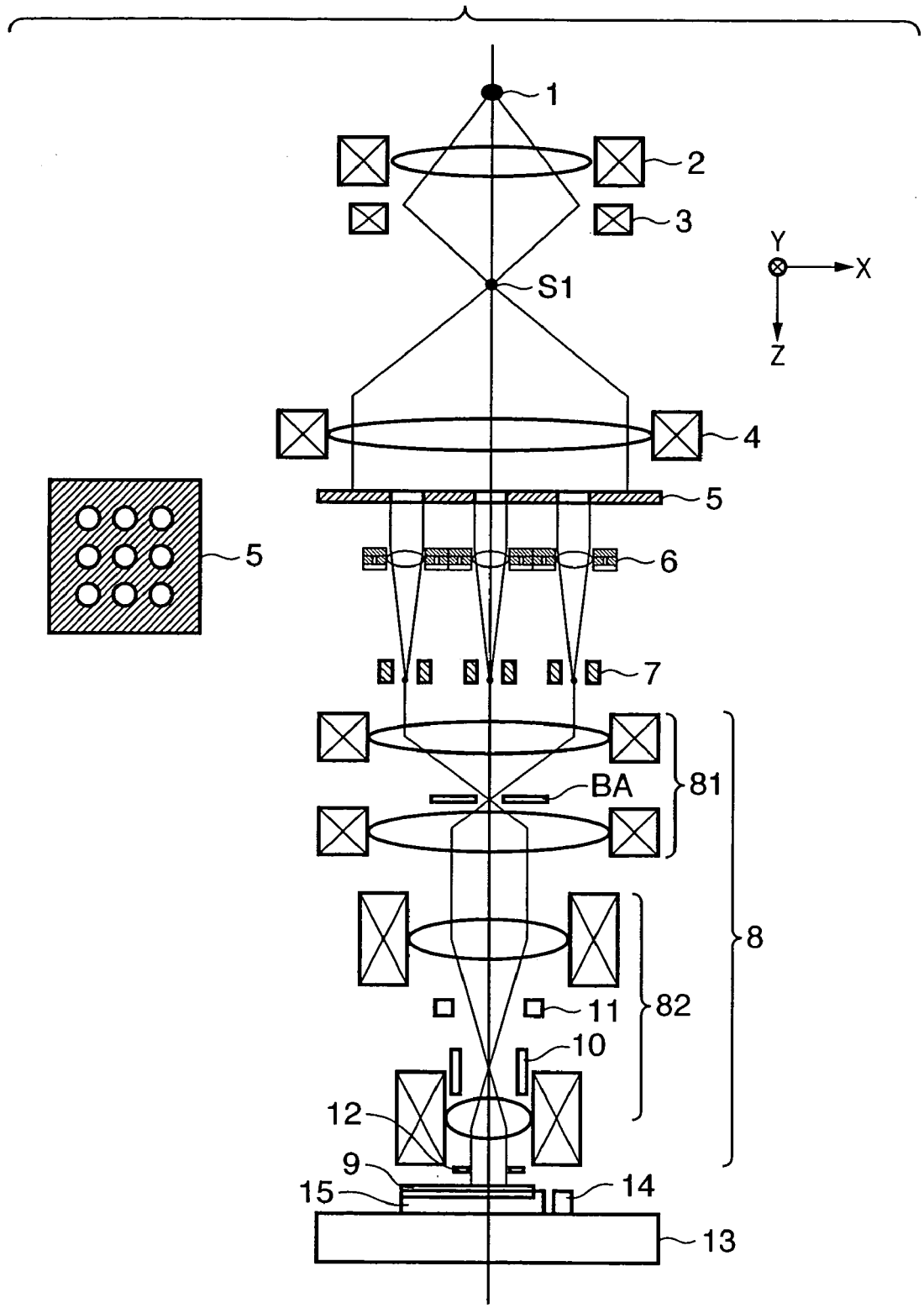
FIG. 1 is a view schematically showing the main part of an electron exposure apparatus according to an embodiment of the present invention.

FIG. 1 is a view schematically showing the main part of an electron beam exposure apparatus according to an embodiment of the present invention. In FIG. 1, an electron beam generated by an electron gun (not shown) forms a crossover image 1 (to be referred to as an electron source 1 hereinafter). An electron beam emitted from the electron source 1 passes through a beam shaping optical system 2 and forms an image SI of the electron source 1. At this time, a first stigmator 3 serving as a magnetic octupole stigmator can cause astigmatism in the image SI. This astigmatism can correct any astigmatism in an electron beam image projected onto a wafer 9 (to be described later).

The electron beam from the image SI becomes almost parallel through a collimator lens 4. The almost parallel electron beam comes incident on an aperture array 5 having a plurality of apertures. The aperture array 5 has the plurality of apertures, and the almost parallel electron beam passes through the apertures to be divided into a plurality of electron beams. The plurality of electron beams derived from the aperture array 5 form intermediate images of the image SI through an electrostatic lens array 6 having a plurality of electrostatic lenses. A blanker array 7 which has a plurality of blankers is arranged on the plane of the intermediate images.

A reduction electron optical system 8 comprising two symmetric magnetic doublet lenses 81 and 82 is provided downstream of the intermediate image plane. The plurality of intermediate images are projected onto the wafer 9. At this time, electron beams deflected by the blanker array 7 are shielded by a blanking aperture BA and thus do not come incident on the wafer 9. On the other hand, electron beams not deflected by the blanker array 7 are not shielded by the blanking aperture BA and thus come incident on the wafer 9. That is, the blanker array 7 individually controls to apply/not to apply (performs on-off control for) the plurality of electron beams derived from the aperture array 5 to the wafer 9.

A deflector 10 which simultaneously displaces a plurality of electron beams in the X and Y directions to desired positions, a second stigmator 11 serving as an electrostatic octupole stigmator which simultaneously adjusts any astigmatism of the plurality of electron beams, and a focus coil 12 which simultaneously adjusts the focuses of the plurality of electron beams are arranged in the lower doublet lens 82. Reference numeral 13 denotes an X-Y stage 13 on which the wafer 9 is mounted and which can move in the X and Y directions perpendicular to the optical axis. An electrostatic chuck 15 for chucking the wafer 9 and a semiconductor detector 14 for measuring the shape of electron beams which has a single knife edge extending in the X and Y directions on the electron beam incident side are arranged on the X-Y stage 13. The X-direction shape of electron beams can be measured using a change in output of the semiconductor detector 14 when the electron beams are moved to perform scanning in the Y direction with respect to the single knife edge extending in the X direction. The Y-direction shape of the electron beams can be measured using a change in output of the semiconductor detector 14 when the electron beams are moved to perform scanning in the X direction with respect to the single knife edge extending in the Y direction.

Note that the first stigmator 3 may be arranged at any position between the light source 1 and the aperture array 5 but it is preferably arranged between the light source 1 and a position where the image SI is to be formed. In this case, when the beam shaping optical system 2 forms the charged particle source image SI, the first stigmator 3 will cause astigmatism. For example, the first stigmator 3 is used to correct any astigmatism which does not change upon deflecting the electron beams such as one caused by lens decentering in apparatus assembly.

The second stigmator 11 is used to correct any astigmatism which changes upon deflecting electron beams.

<Explanation of System Configuration and Exposure Method>

Figure 2:
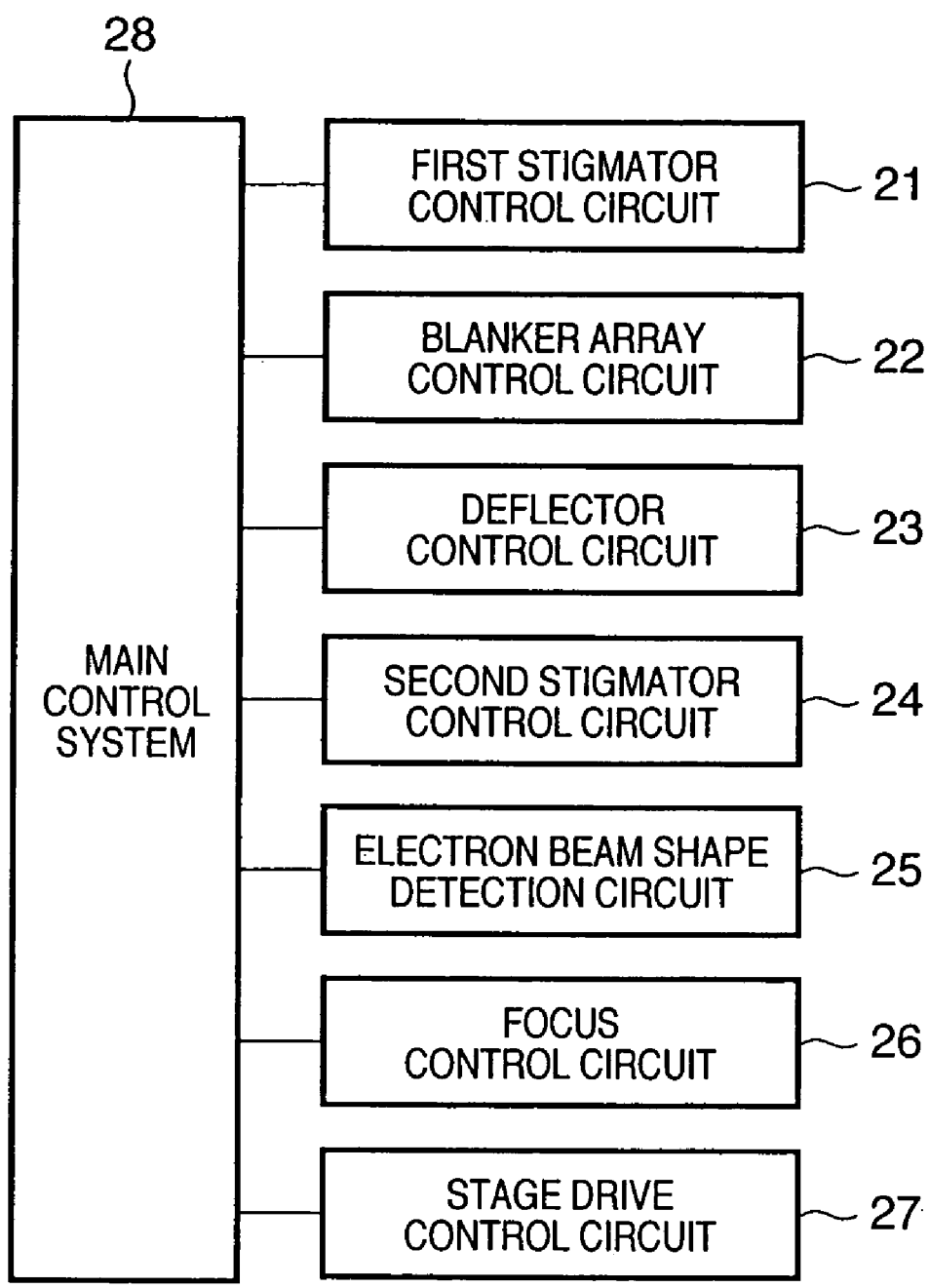
FIG. 2 is a diagram for explaining a system according to this embodiment.

FIG. 2 is a diagram of the configuration of a system according to this embodiment.

A first stigmator control circuit 21 is a control circuit which controls astigmatism of the electron source image SI by adjusting a difference in focal length in a direction perpendicular to the first stigmator 3. A blanker array control circuit 22 is a control circuit which individually controls the plurality of blankers of the blanker array 7. A deflector control circuit 23 is a control circuit which controls the deflector 10. A second stigmator control circuit 24 is a control circuit which controls astigmatism of the reduction electron optical system 8 by adjusting a difference in focal length in a direction perpendicular to the second stigmator 11. An electron beam shape detection circuit 25 is a detection circuit which processes signals from the semiconductor detector 14. A focus control circuit 26 is a control circuit which controls the focal position of the reduction electron optical system 8 by adjusting the focal length of the focus coil 12. A stage drive control circuit 27 is a control circuit which controls to drive the X-Y stage 13 in cooperation with a laser interferometer (not shown) which detects the position of the X-Y stage 13. A main control system 28 controls the above-mentioned plurality of control circuits and manages the entire electron beam exposure apparatus.

Figure 3:
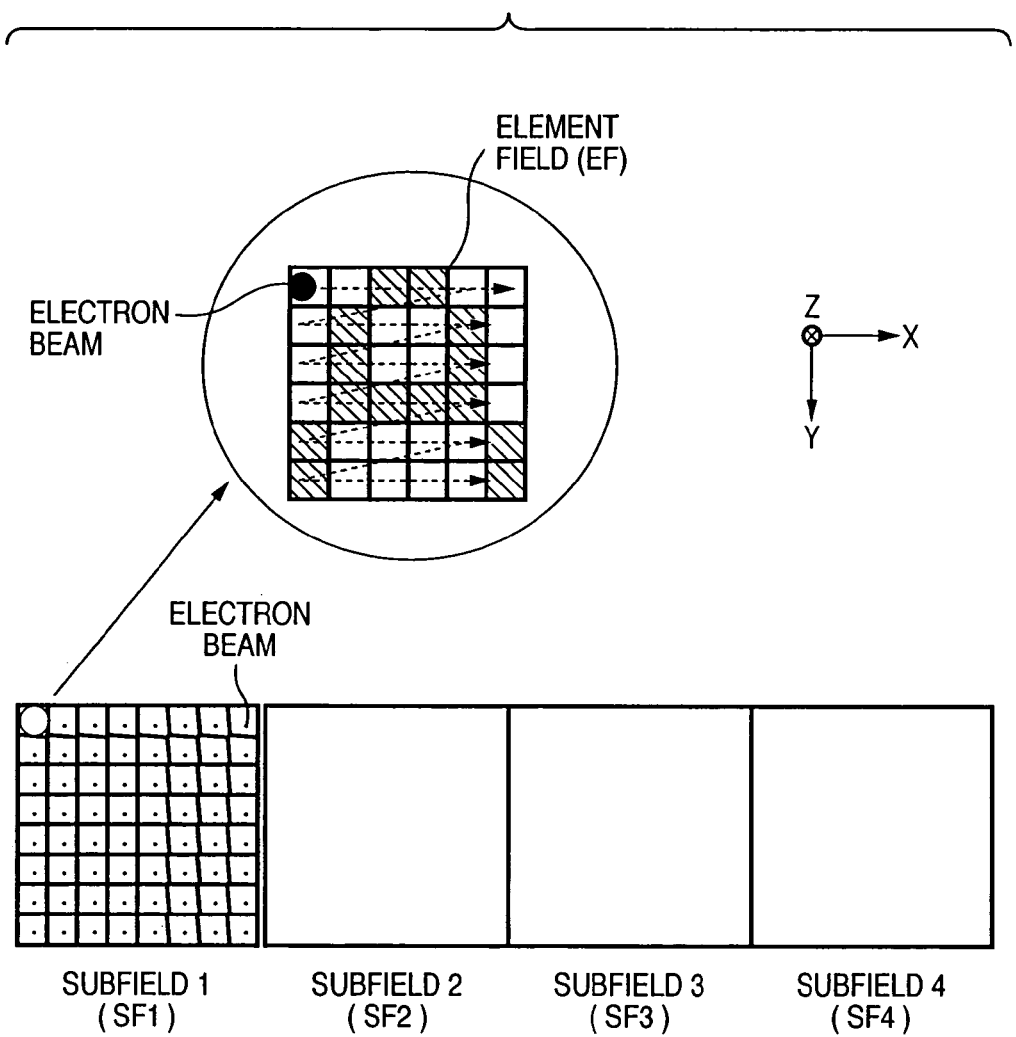
FIG. 3 is a view for explaining a exposure method according to this embodiment.

FIG. 3 is a view for explaining an expose method according to this embodiment.

The main control system 28 instructs the deflector control circuit 23 on the basis of exposure control data to make the deflector 10 deflect a plurality of electron beams. The main control system 28 also instructs the blanker array control circuit 22 to perform on-off control for the blankers of the blanker array 7 in accordance with a pattern to which the wafer 9 is to be exposed (to be drawn on the wafer 9). Each electron beam performs scanning exposure for a corresponding element exposure region (EF) on the wafer 9, as shown in FIG. 3. Electron beam element exposure regions (EF) are two-dimensionally juxtaposed to each other, and a subfield (SF) comprising a plurality of element exposure regions (EF) to be simultaneously exposed is exposed.

In one example, the number of electron beams is 32×32=1,024. Each electron beam draws an element exposure region (EF) of about 2 µm square. The diameter of one electron beam on the wafer 9 is about 60 nm. 1,024 (=32×32) element exposure regions constitute one subfield (SF). The size of one subfield (SF) is about 64 µm square.

After the main control system 28 exposes one subfield (SF1), it instructs the deflector control circuit 23 to make the deflector 10 deflect a plurality of electron beams in order to exposure the next subfield (SF2). At this time, a change in subfield due to the deflection causes a change in aberration generated when each electron beam is reduced and projected through the reduction electron optical system 8. The second stigmator control circuit 24 performs correction in accordance with instructions from the main control system 28 such that the astigmatism becomes constant. The astigmatism can be measured as the shape of the electron beams using the semiconductor detector 14 and the knife edge extending in the X and Y directions. The relationship between the deflected position and the beam shape is calculated in advance. Astigmatism which changes due to deflection caused by subfield switching during exposure is corrected under the control of the second stigmator control circuit 24 using the second stigmator 11.

In the above-mentioned embodiment, after a group of about-2-mm-square subfields each comprising a group of 1,024 (=32×32) about-64-µm-square subfields are exposed, the X-Y stage is moved by about 2 mm to expose the next subfield group (1,024 subfields). Although not shown, the deflector 10 comprises a main deflector used when the deflection width is large, and a sub-deflector used when the deflection width is small. The main deflector is an electromagnetic deflector while the sub-deflector is an electrostatic deflector. The electrostatic sub-deflector performs scanning during exposure while the electromagnetic main deflector switches between subfields.

<First Operation Explanation>

Operation of an electron beam exposure apparatus according to the first embodiment of the present invention will be described with reference to FIG. 4. As the wafer process of the exposure apparatus, a main control system 28 executes the following steps.

(Step 4-1) The main control system 28 makes a deflector control circuit 23 deflect a plurality of electron beams to a subfield SF1 and makes an electron beam shape detection circuit 25 scan the knife edge of a semiconductor detector 14 using only central beams located at the almost center of the subfield, thereby measuring the diameters in the X and Y directions of the beams. The main control system 28 makes a focus control circuit 26 change the focus and measures the beam diameters in the X and Y directions. Let Fx be a focus position where the beam diameter in the X direction is the smallest; Fy, a focus position where the beam diameter in the Y direction is the smallest; and Fx−Fy, the astigmatism amount of the subfield. Sequential switching is performed between subfields, and the astigmatism amount of central beams for each subfield is detected.

Figure 5:
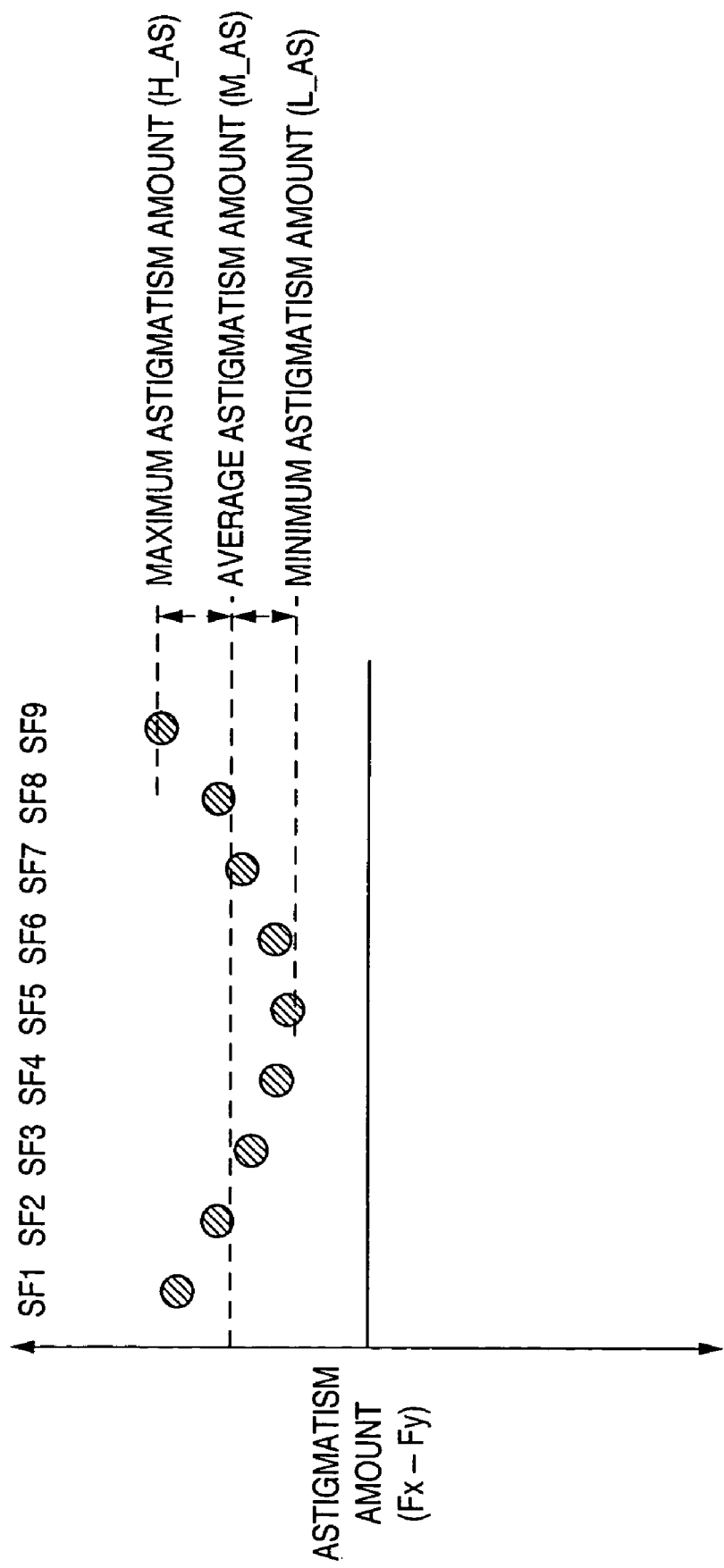
FIG. 5 is a graph for explaining the average astigmatism amount.
Figure 8A:
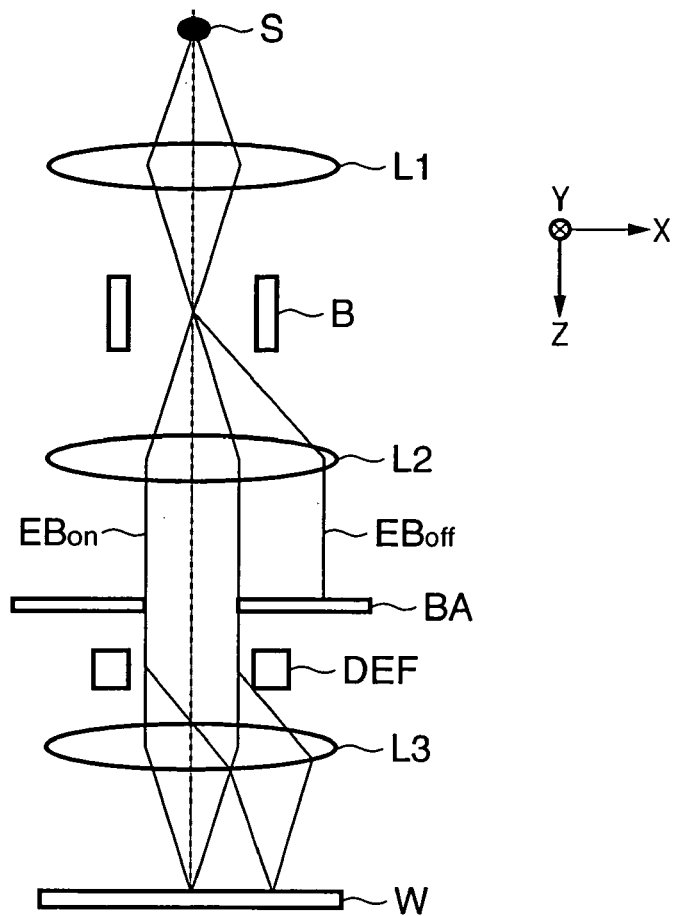
FIGS. 8A and 8B are views for explaining a conventional scanning electron beam exposure apparatus.
Figure 8B:
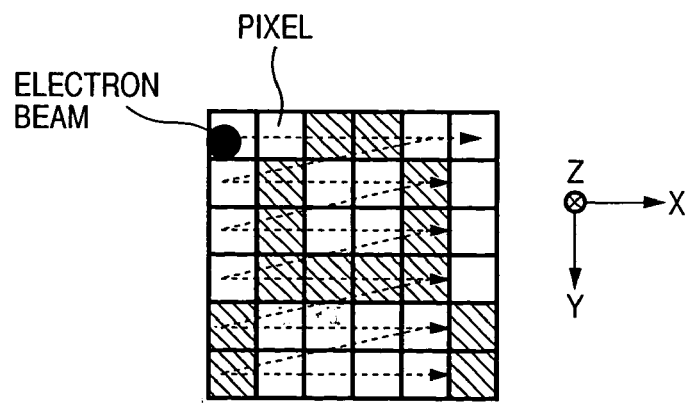
Figure 9A:
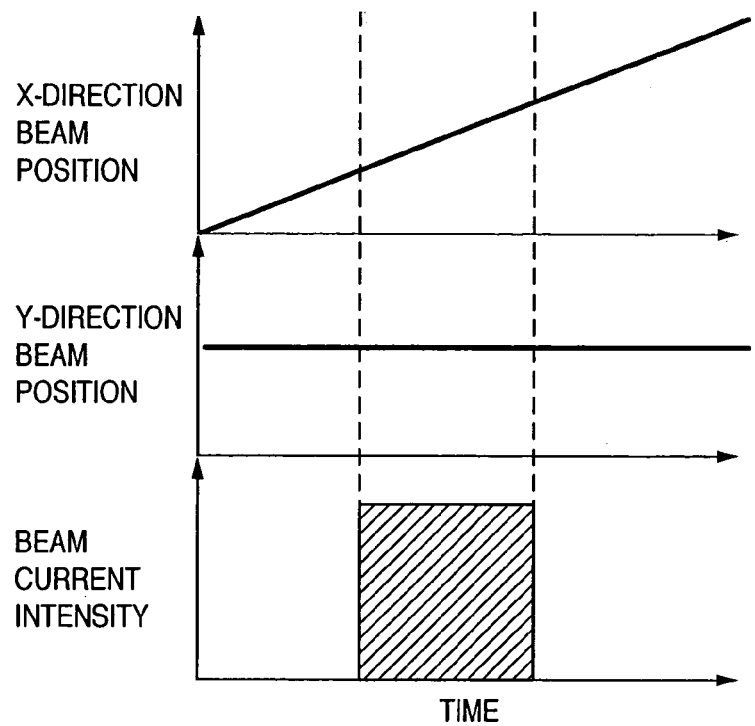
FIGS. 9A to 9C are graphs for explaining the pixel intensity distribution obtained by conventional scanning.
Figure 9B:
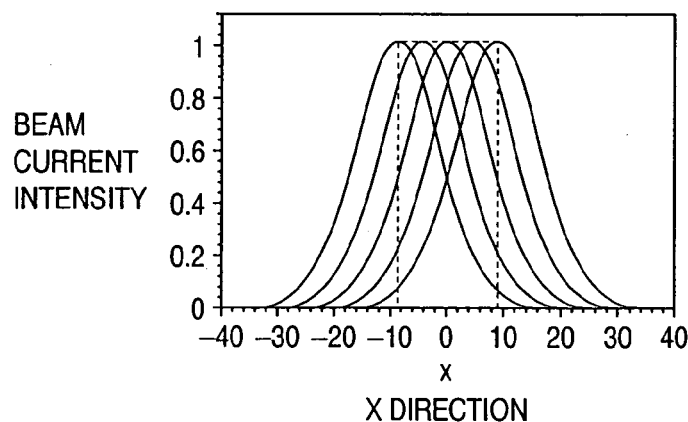
Figure 9C:
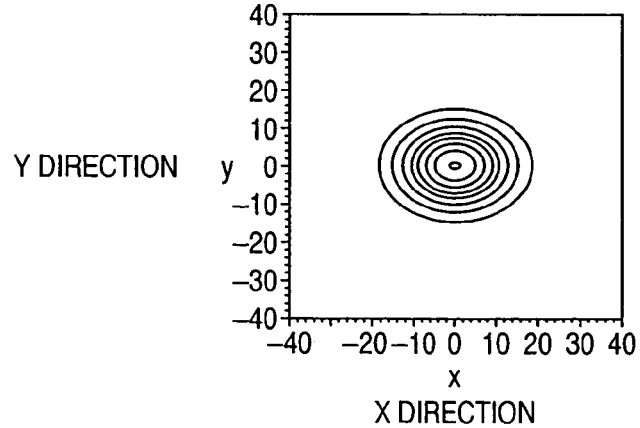

(Step 4-2) In step 4-1, the astigmatism amount of central beams for each subfield, as shown in FIG. 5, is obtained. With this astigmatism amount, the maximum astigmatism amount (H_AS) and minimum astigmatism amount (L_AS) are calculated, thereby calculating the average astigmatism amount (M_AS=(H_AS+L_AS)/2).

(Step 4-3) An astigmatism amount obtained by subtracting the average astigmatism amount from the astigmatism amount for each subfield is used as the varying astigmatism amount for each subfield. The average astigmatism amount can be considered as an astigmatism amount which does not vary during exposure when subfield switching is performed. The varying astigmatism amount can be considered as an astigmatism amount which varies.

(Step 4-4) The average astigmatism amount is corrected by a first stigmator 3. The function of the first stigmator 3 will be described with reference to FIG. 6. When the first stigmator 3 is not driven, an electron source image SI is almost circular, and a plurality of electron source images on a blanker array 7 are also almost circular. Astigmatism of a reduction electron optical system 8 makes elliptical a plurality of electron source images on a wafer 9. On the other hand, when the first stigmator 3 is driven, the electron source image SI becomes elliptical so as to cancel any astigmatism of the reduction electron optical system 8. At the same time, the plurality of electron source images on the blanker array 7 become elliptical. As a result, the plurality of electron source images on the wafer 9 becomes almost circular. To correct astigmatism, astigmatism is made to occur in the original electron source image SI, and no aberration other than astigmatism of the reduction electron optical system 8 occurs.

The first stigmator 3 adjusts the amount of astigmatism before the electron source image SI is reduced. To correct astigmatism of the reduction electron optical system 8, an astigmatism amount larger than that for a second stigmator 11 must be added because of longitudinal magnification. For this reason, an electromagnetic one is used as the first stigmator 3 to increase the driving amount for correcting astigmatism. On the other hand, an electrostatic one is used as the second stigmator. An electromagnetic stigmator has poorer responsiveness than an electrostatic stigmator. Under the circumstances, in this embodiment, the average astigmatism amount is corrected by the magnetic first stigmator 3 while the varying astigmatism amount is corrected by the electrostatic second stigmator 11.

(Step 4-5) The wafer 9 is loaded onto a stage 13.

(Step 4-6) The main control system 28 makes the deflector control circuit 23 deflect a plurality of electron beams to a subfield to be exposed.

(Step 4-7) The main control system 28 instructs the second stigmator to correct a varying astigmatism amount corresponding to the subfield to be exposed, concurrently with step 4-5.

(Step 4-8) Exposure is performed for the subfield to be exposed.

(Step 4-9) When exposure for all subfields completes, the flow advances to step 4-10; otherwise, the flow returns to step 4-6.

(Step 4-10) The wafer 9 is unloaded from the stage 13.

According to this embodiment, astigmatism of a reduction electron optical system can be corrected while suppressing generation of an aberration other than astigmatism. This makes it possible to expose a wafer to a desired fine pattern. If this apparatus is used in the manufacturing of devices, devices can be manufactured at higher yield than a conventional case.

<Second Operation Explanation>

Operation of an electron beam exposure apparatus according to the second embodiment of the present invention will be described with reference to FIG. 7. As the wafer process of the exposure apparatus, a main control system 28 executes the following steps.

(Step 7-1) The main control system 28 makes an electron beam shape detection circuit 25 scan the knife edge of a semiconductor detector 14 using only central beams located at the almost center of a subfield, thereby measuring the diameters in the X and Y directions of the beams.

(Step 7-2) In step 7-1, the beam shape in the X direction (scanning direction) is moving-averaged by the width of each pixel and is stored.

(Step 7-3) An astigmatism amount in which the X-direction moving average beam shape almost coincides with the Y-direction moving average beam shape is calculated.

(Step 7-4) The calculated astigmatism amount is corrected by a first stigmator 3. Astigmatism is adjusted such that the size of electron beams on the substrate in the scanning direction (X direction) is smaller than that in a direction perpendicular to the direction (Y direction).

In addition, the function of the first stigmator 3 will be described with reference to FIG. 6. When the first stigmator 3 is not driven, an electron source image SI is almost circular, and a plurality of electron source images on a blanker array 7 are also almost circular. However, electron beams distort in the scanning direction (X direction), as described above, and a plurality of electron source images on a wafer 9 have the shape of an ellipse extending in the X direction. On the other hand, when the first stigmator 3 is driven, astigmatism is adjusted such that the size in the scanning direction (e.g., the width in the X direction) of the electron beams on the substrate is smaller than that in a direction perpendicular to the direction (e.g., the width in the Y direction). The electron source image SI has the shape of an ellipse extending in the Y direction. At the same time, the plurality of electron source images on the blanker array 7 have the shape of an ellipse extending in the Y direction. As a result, any X-direction distortion in the plurality of electron source images on the wafer 9 is corrected, and the electron source images become almost circular. To correct distortion of electron beams, astigmatism is made to occur in the original electron source image SI, and no aberration other than astigmatism of a reduction electron optical system 8 occurs.

(Step 7-5) The wafer 9 is loaded onto a stage 13.

(Step 7-6) The main control system 28 makes the deflector control circuit 23 deflect a plurality of electron beams to a subfield to be exposed.

(Step 7-7) Exposure is performed for the subfield to be exposed.

(Step 7-8) When exposure for all subfields completes, the flow advances to step 7-9; otherwise, the flow returns to step 7-6.

(Step 7-9) The wafer 9 is unloaded from the stage 13.

As described above, a scanning charged particle beam exposure apparatus according to this embodiment can correct any distortion of electron beams due to scanning and can expose a wafer to a desired pattern. If this apparatus is used in the manufacturing of devices, devices can be manufactured at higher yield than a conventional case.

(Device Production Method)

An example of a device production method using the above-mentioned electron beam exposure apparatus will be explained.

Figure 10:
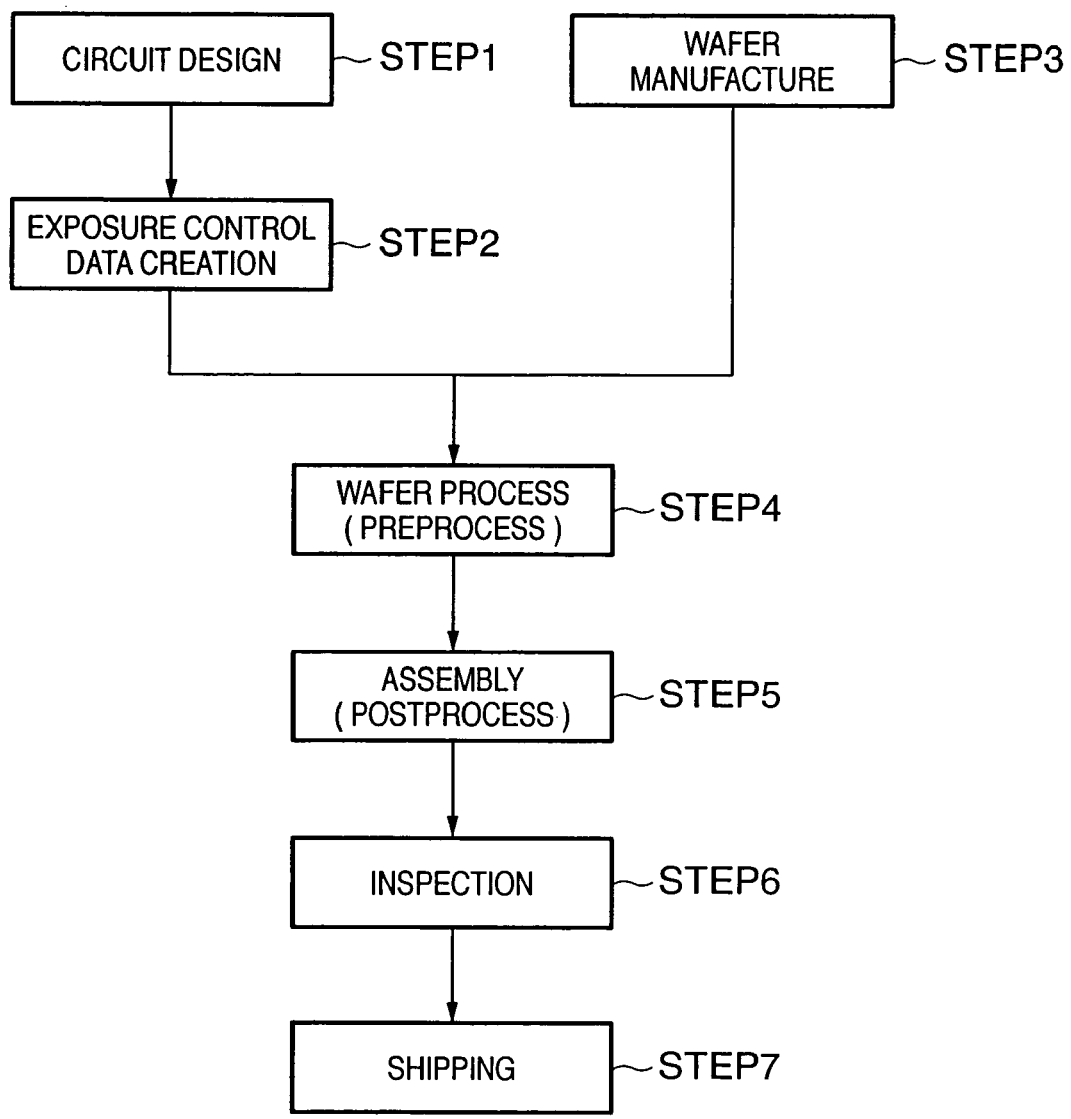
FIG. 10 is a flowchart for explaining the flow of a device manufacturing process.

FIG. 10 shows the manufacturing flow of a microdevice (e.g., a semiconductor chip such as an IC or LSI, liquid crystal panel, CCD, thin-film magnetic head, micromachine, or the like). In step 1 (circuit design), a semiconductor device circuit is designed. In step 2 (exposure control data creation), exposure control data for an exposure apparatus is created based on the designed circuit pattern. In step 3 (wafer manufacture), a wafer is manufactured by using a material such as silicon. In step 4 (wafer process) called a preprocess, an actual circuit is formed on the wafer by lithography using the prepared wafer and the exposure apparatus, into which the exposure control data is input. Step 5 (assembly) called a postprocess is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and durability test of the semiconductor device manufactured in step 5. After these steps, the semiconductor device is completed and shipped (step 7).

FIG. 11 shows the detailed flow of the above-mentioned wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is printed onto the wafer using the above-mentioned exposure apparatus. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer.

With the manufacturing method according to this embodiment, highly integrated semiconductor devices which have been difficult to manufacture by a conventional method can be manufactured at low cost.

As has been described above, a charged particle beam exposure apparatus according to the present invention can reduce, when correcting astigmatism of a reduction electron optical system, generation of an aberration other than astigmatism and can perform exposure to a desired pattern. Also, if this apparatus is used in the manufacturing of devices, devices can be manufactured at higher yield than a conventional case.

According to the present invention, when performing exposure by scanning with charged particle beams, any distortion of electron beams due to the scanning can be reduced, and,exposure to a desired fine pattern can be performed. If a scanning charged particle beam exposure apparatus to which the present invention is applied is used in the manufacturing of devices, devices can be manufactured at higher yield than a conventional case.

As many apparently widely different embodiments of the present invention can be made without departing from the spirit and scope thereof, it is to be understood that the invention is not limited to the specific embodiments thereof except as defined in the claims.

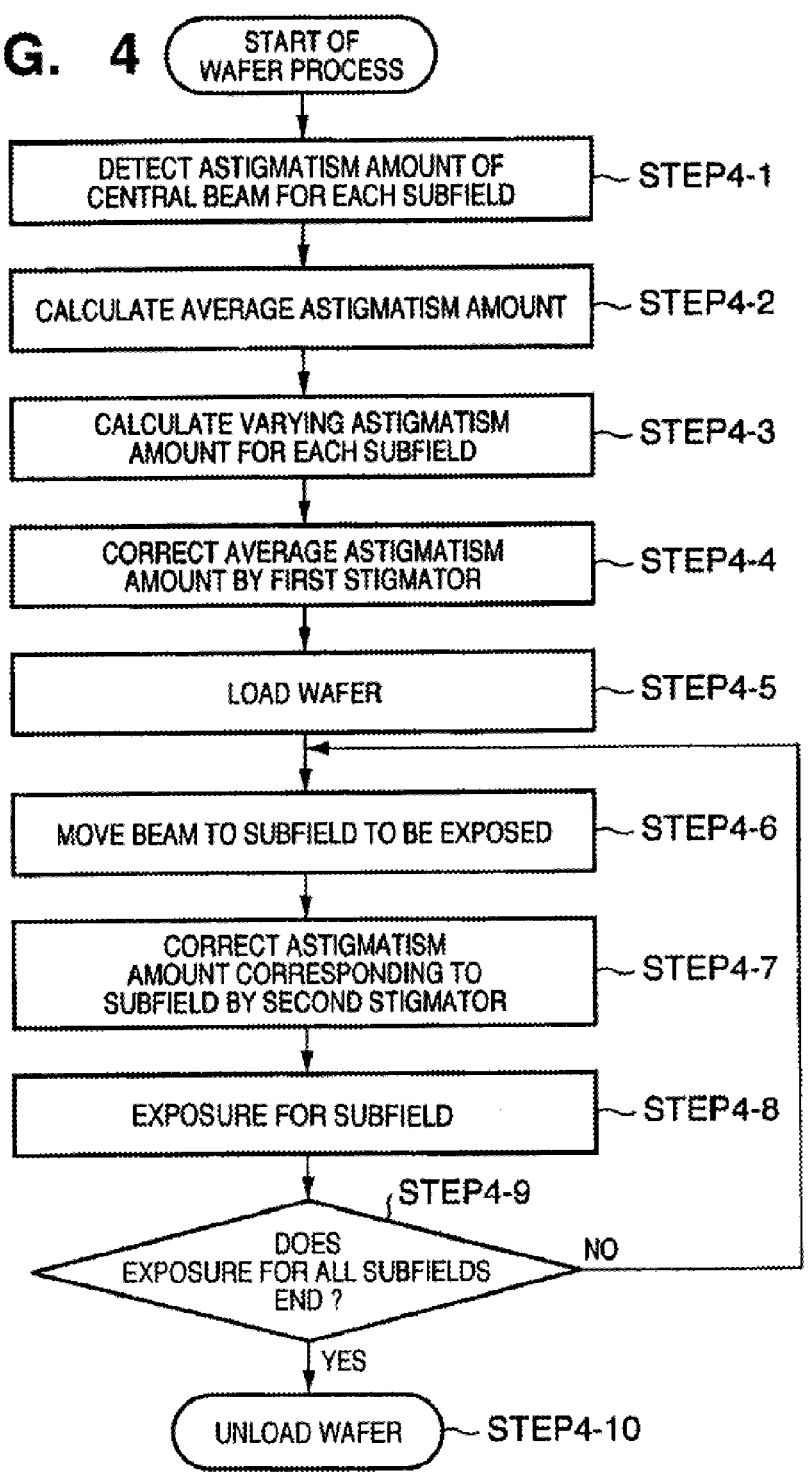

What is claimed is:

1. A charged particle beam exposure apparatus which exposes a substrate using a charged particle beam, comprising:
   first formation means for forming an image of a charged particle source which emits a charged particle beam;
   second formation means, which has an aperture array with a plurality of apertures, for forming a plurality of images of the charged particle source from the image of the charged particle source through the aperture array;
   a reduction electron optical system which reduces and projects the plurality of images of the charged particle source onto the substrate; and
   first astigmatism generation means, which is arranged between the charged particle source and the aperture array of the second formation means, for generating astigmatism when said first formation means forms the image of the charged particle source in order to correct astigmatism generated in said reduction electron optical system.

2. An apparatus according to claim 1, further comprising second astigmatism generation means for generating astigmatism in said reduction electron optical system, wherein out of astigmatisms generated in said reduction electron optical system, astigmatism which does not vary during exposure is corrected by said first astigmatism generation means while varying astigmatism is corrected by said second astigmatism generation means.

3. An apparatus according to claim 2, wherein said second astigmatism generation means is an electrostatic astigmatism generation means.

4. An apparatus according to claim 1, wherein said first astigmatism generation means is arranged between the charged particle source and the image of the charged particle source formed by said first formation means.

5. An apparatus according to claim 1, wherein said first astigmatism generation means is a magnetic astigmatism generation means.

6. A device manufacturing method comprising:
   an adjustment step of making a size of a charged particle beam in a scanning direction smaller than a size of a charged particle beam in a direction perpendicular to the scanning direction;
   an exposure step of exposing a substrate to a pattern using the charged particle beam adjusted in the adjustment step; and a development step of developing the substrate which has been exposed to the pattern in the exposure step.

7. A charged particle beam exposure method of exposing a substrate by scanning with a charged particle beam, comprising
an adjustment step of making a size of a charged particle beam in a scanning direction smaller than a size of a charged particle beam in a direction perpendicular to the scanning direction.

8. A method according to claim 7, further comprising:
a first measurement step of measuring the size of the charged particle beam in the scanning direction; and
a second measurement step of measuring the size of the charged particle beam in the direction perpendicular to the scanning direction,
wherein a result of moving-averaging a result of the first measurement step and a result of the second measurement step are evaluated, and the adjustment step is executed based on a result of the evaluation.

9. A device manufacturing method,
wherein a charged particle beam exposure method as defined in claim 7 is used to manufacture devices.

10. A charged particle beam exposure apparatus which exposes a substrate using a charged particle beam, comprising:
a scanning unit which scans a substrate with a charged particle beam; and
an adjusting unit which adjusts astigmatism of the charged particle beam on the basis of a scanning direction of the charged particle beam.

11. An apparatus according to claim 10, wherein said adjusting unit adjusts astigmatism of said charged particle beam such that a size in a scanning direction of the charged particle beam on said substrate becomes smaller than a size in a direction perpendicular to the scanning direction.

12. A device manufacturing method comprising:
a scanning step of scanning a substrate with a charged particle beam;
an adjustment step of adjusting astigmatism of the charged particle beam on the basis of a scanning direction of the charged particle beam;
an exposure step of exposing a substrate to a pattern using the charged particle beam adjusted in the adjustment step; and
a development step of developing the substrate which has been exposed to the pattern in the exposure step.

* * * * *

UNITED STATES PATENT AND TRADEMARK OFFICE
CERTIFICATE OF CORRECTION

| | |
|---|---|
| PATENT NO. | : 7,005,659 B2 |
| APPLICATION NO. | : 10/885666 |
| DATED | : February 28, 2006 |
| INVENTOR(S) | : Masato Muraki et al. |

It is certified that error appears in the above-identified patent and that said Letters Patent is hereby corrected as shown below:

SHEET 4

Figure 4:
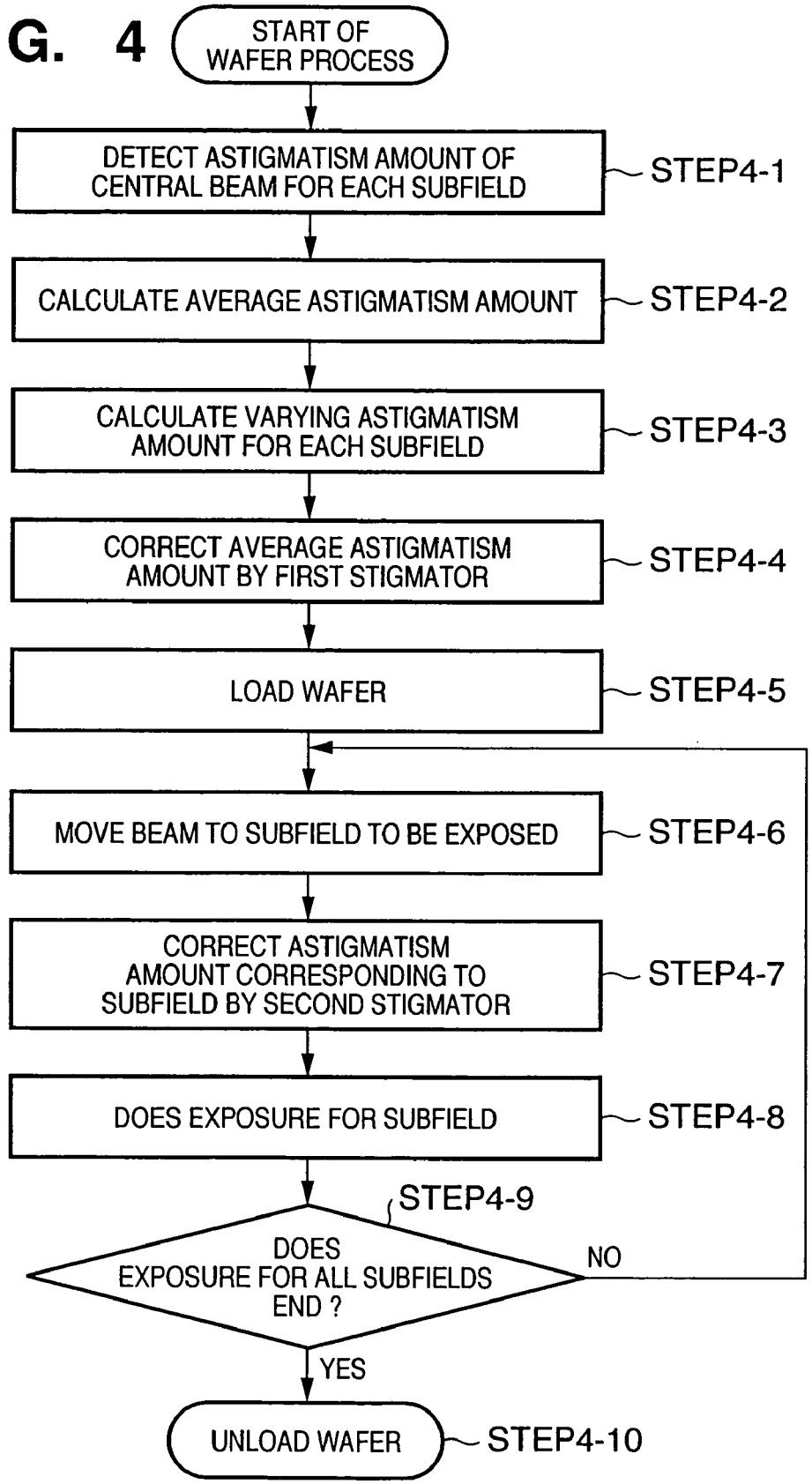
FIG. 4 is a flowchart for explaining exposure operation according to the first embodiment of the present invention.

FIG. 4, "DOES" should be deleted. As shown on attached page.

SHEET 7

Figure 7:
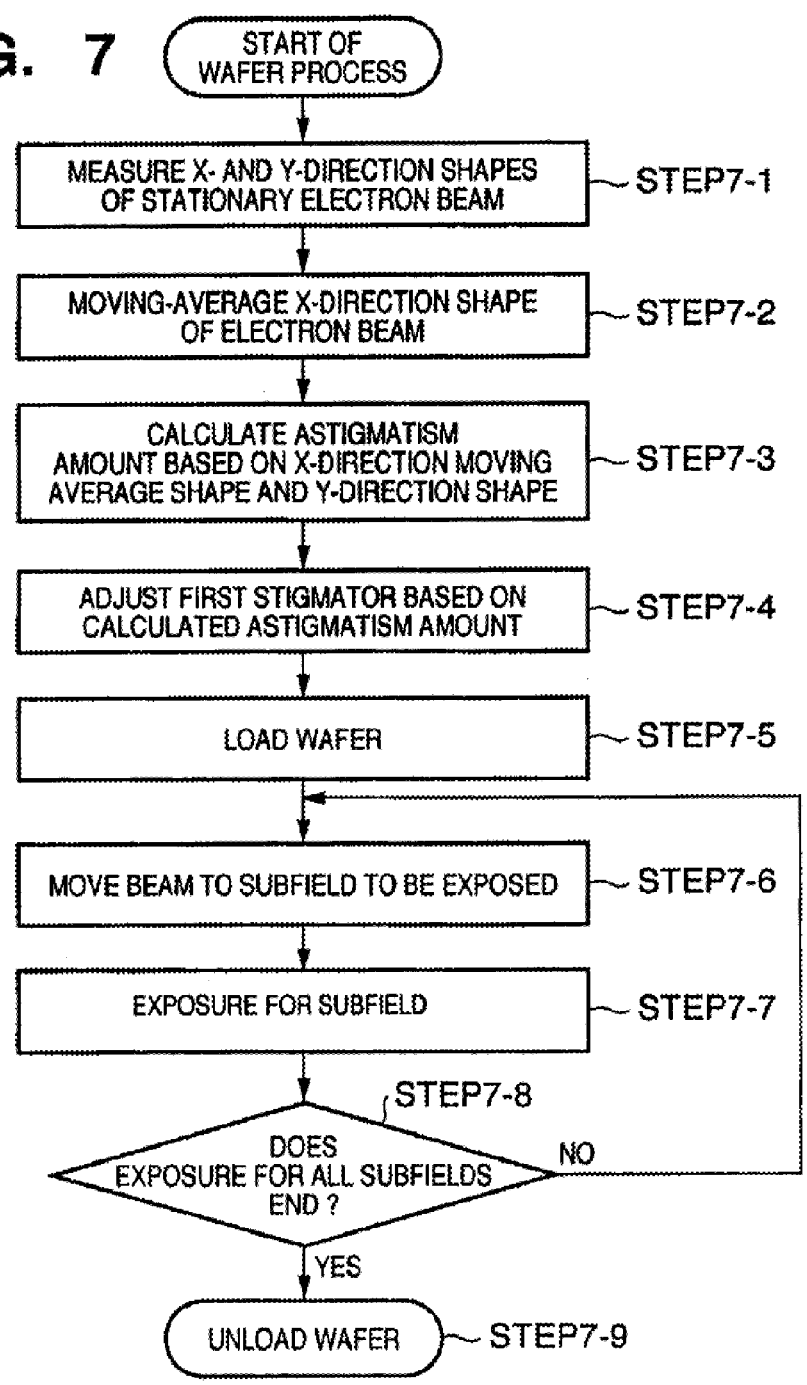
FIG. 7 is a flowchart for explaining exposure operation according to the second embodiment of the present invention.

FIG. 7, "DOES" should be deleted. As shown on attached page.

COLUMN 10

Line 12, "and, exposure" should read --and exposure--.

COLUMN 11

Line 5, "comprising"should read --comprising:--.

Signed and Sealed this

Fifteenth Day of April, 2008

JON W. DUDAS
*Director of the United States Patent and Trademark Office*